(12) United States Patent
Koh et al.

(10) Patent No.: US 8,435,655 B2
(45) Date of Patent: May 7, 2013

(54) SECONDARY BATTERY

(75) Inventors: Seok Koh, Yongin-si (KR); Eunok Kwak, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 825 days.

(21) Appl. No.: 12/458,897

(22) Filed: Jul. 27, 2009

(65) Prior Publication Data

US 2010/0143788 A1 Jun. 10, 2010

(30) Foreign Application Priority Data

Dec. 5, 2008 (KR) ........................ 10-2008-0123203

(51) Int. Cl.
*H01M 2/22* (2006.01)
*H01M 2/30* (2006.01)

(52) U.S. Cl.
USPC ............... 429/7; 320/128; 320/137; 429/161; 429/178; 429/179; 429/453; 429/507

(58) Field of Classification Search ...... 429/7, 161–186, 429/134, 452, 453, 507–509; 320/127–137
See application file for complete search history.

(56) References Cited

U.S. PATENT DOCUMENTS

| 7,733,055 B2* | 6/2010 | Seo ............................... 320/112 |
| 2003/0108780 A1* | 6/2003 | Iwaizono et al. ................. 429/7 |
| 2005/0112456 A1* | 5/2005 | Kozu et al. ...................... 429/62 |
| 2006/0083982 A1* | 4/2006 | Jung et al. ...................... 429/164 |
| 2006/0093897 A1* | 5/2006 | Choi et al. ....................... 429/62 |
| 2006/0257731 A1* | 11/2006 | Yoon ............................. 429/176 |
| 2007/0026302 A1* | 2/2007 | Yoon ............................. 429/129 |
| 2007/0141868 A1* | 6/2007 | Park ............................... 439/74 |
| 2007/0202364 A1* | 8/2007 | Uh et al. .......................... 429/7 |
| 2007/0202396 A1* | 8/2007 | Jung ............................. 429/174 |
| 2008/0107964 A1* | 5/2008 | Choi ............................. 429/174 |
| 2008/0241675 A1* | 10/2008 | Enari et al. .................... 429/179 |
| 2009/0092860 A1* | 4/2009 | Yamamoto et al. ............... 429/7 |

FOREIGN PATENT DOCUMENTS

| JP | 06-029015 A | 2/1994 |
| JP | 2002-231201 A | 8/2002 |
| KR | 10 2006-0041955 A | 5/2006 |
| KR | 10 2007-0108800 A | 11/2007 |

* cited by examiner

*Primary Examiner* — Joseph Drodge
(74) *Attorney, Agent, or Firm* — Lee & Morse, P.C.

(57) ABSTRACT

A secondary battery including a bare cell, a protection circuit module electrically coupled to the bare cell, and a holder between the bare cell and the protection circuit module, wherein the protection circuit module includes a flexible printed circuit board having an upper and a lower surface, a charging/discharging terminal on the upper surface of the flexible printed circuit board and a protection circuit unit on the lower surface of the flexible printed circuit board opposite to the charging/discharging terminal, and the holder is disposed on the protection circuit unit on the lower surface of the flexible printed circuit board.

11 Claims, 8 Drawing Sheets

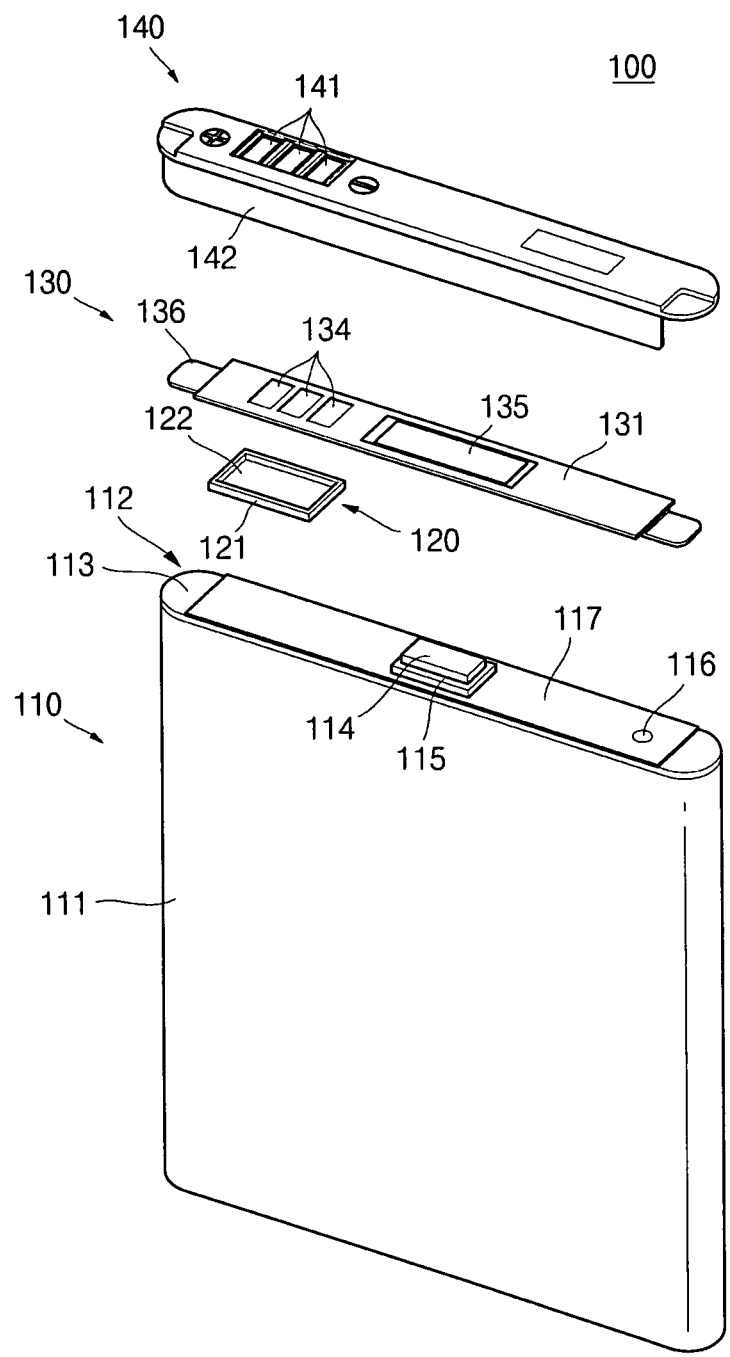

SECONDARY BATTERY

BACKGROUND

1. Field

Embodiments relate to a secondary battery.

2. Description of the Related Art

Generally, a secondary battery may include a bare cell, a protection circuit module and an upper case. The upper case may be disposed on an upper part of the protection circuit module. The protection circuit module may include an insulation substrate on which electrical components, e.g., an integrated circuit (IC), a charging/discharging terminal, a charging/discharging switch and a passive element are installed. The protection circuit module may prevent performance degradation of the secondary battery.

The insulation substrate used for the protection circuit module may be made of flexible material and may have a thickness of more than about 0.4 mm. Recently, with the development of lightweight and small-sized electronic devices, attempts have been made to minimize the size of the secondary battery by reducing a thickness of a printed circuit board.

SUMMARY

Embodiments are therefore directed to a secondary battery, which substantially overcomes one or more of the problems due to the limitations and disadvantages of the related art.

It is a feature of an embodiment to provide a secondary battery that allows for smooth operation of an external device.

It is another feature of an embodiment to provide a secondary battery that can prevent a charging/discharging terminal of a protection circuit module from being pushed inward when the terminal contacts a terminal of an external device.

At least one of the above and other features and advantages may be realized by providing a secondary battery including a bare cell, a protection circuit module electrically coupled to the bare cell, and a holder between the bare cell and the protection circuit module, wherein the protection circuit module includes a flexible printed circuit board having an upper and a lower surface, a charging/discharging terminal on the upper surface of the flexible printed circuit board and a protection circuit unit on the lower surface of the flexible printed circuit board opposite to the charging/discharging terminal, and the holder is disposed on the protection circuit unit on the lower surface of the flexible printed circuit board.

The holder may include a plate type body, and a receiving part inside the plate type body configured to receive the protection circuit unit.

The receiving part may include a cured resin molding part surrounding the protection circuit unit.

The molding part may include at least one of a cured silicone resin and cured epoxy resin.

The receiving part may include a hole having at least one receiving space and the hole may pass through the body.

The holder may include opposing side surfaces and at least one reinforcing frame, the reinforcing frame may connect the opposing side surfaces so as to provide the receiving part with at least two receiving spaces.

The protection circuit module may have an end and may include a cathode lead tab at the end, the holder may include a side and a stepped fixing part extending from the side, and a portion of the cathode lead tab may be seated on the stepped fixing part.

The fixing part may include a through-hole passing therethrough.

The receiving part may include a groove having a bottom surface defining at least one receiving space.

The body may include at least one resin injection hole.

The holder may have a lower part and an insulation member may be interposed between the lower part of the holder and the bare cell.

The insulation member may include at least one of an insulation tape and cured adhesive.

BRIEF DESCRIPTION OF THE DRAWINGS

The above and other features and advantages will become more apparent to those of ordinary skill in the art by describing in detail exemplary embodiments with reference to the attached drawings, in which:

FIG. 1A illustrates an exploded perspective view of a secondary battery according to an embodiment;

DETAILED DESCRIPTION OF THE INVENTION

Figure 1B:
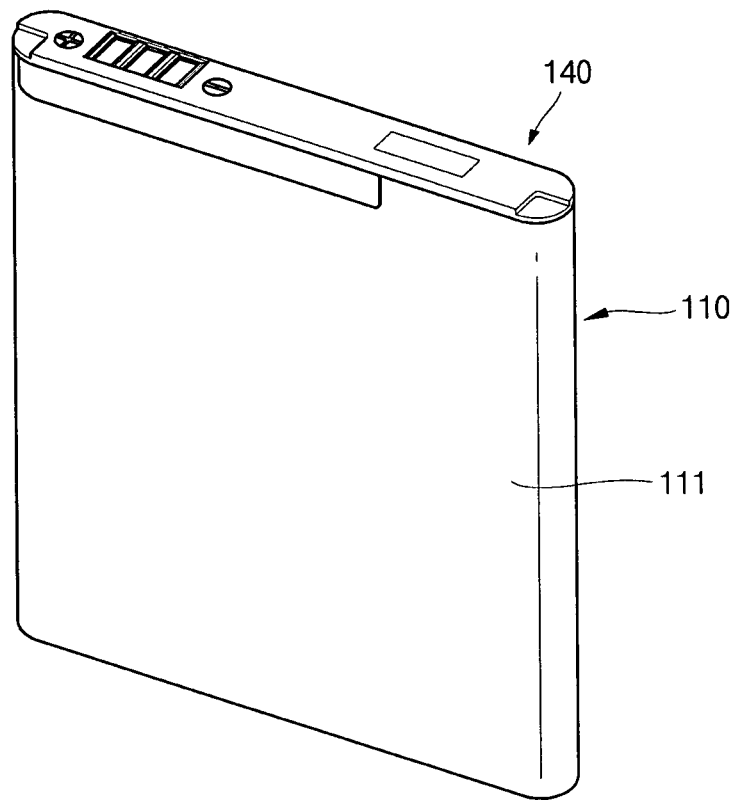
FIG. 1B illustrates a perspective view of the assembled secondary battery of FIG. 1A.

Korean Patent Application No. 10-2008-0123203, filed on Dec. 5, 2008, in the Korean Intellectual Property Office, and entitled "Secondary Battery", is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1C:
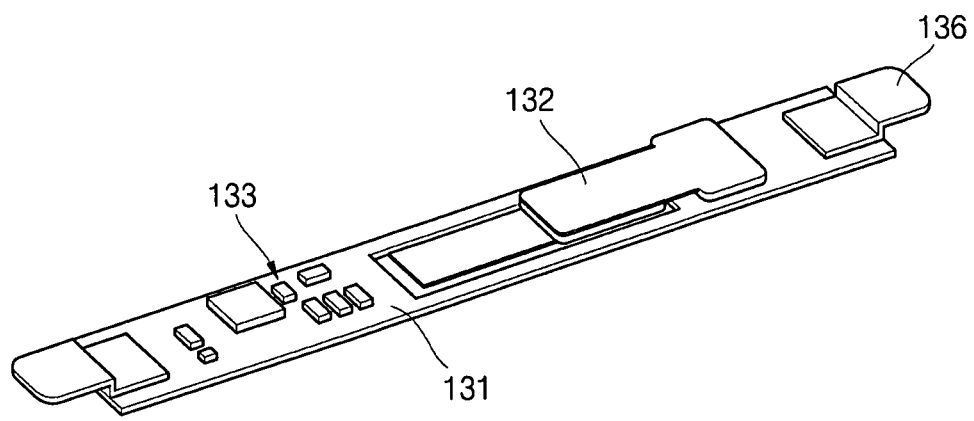
FIG. 1C illustrates a perspective view of the underside of the protection circuit module shown in FIG. 1A.
Figure 1D:
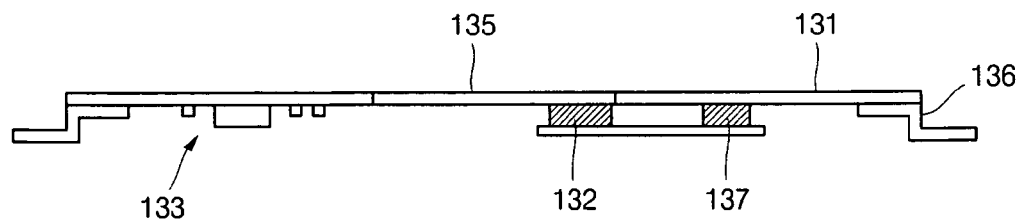
FIG. 1D illustrates a sectional view of the protection circuit module shown in FIG. 1A.

Hereinafter, embodiments will be described in detail with reference to the accompanying drawings. FIG. 1A illustrates an exploded perspective view of a secondary battery according to an embodiment. FIG. 1B illustrates a perspective view of the assembled secondary battery of FIG. 1A. FIG. 1C illustrates a perspective view of the underside of the protection circuit module shown in FIG. 1A. FIG. 1D illustrates a sectional view of the protection circuit module shown in FIG. 1A.

Referring to FIGS. 1A to 1D, a secondary battery 100 may include a bare cell 110, a holder 120, a protection circuit module 130 and an upper case 140. The holder 120 may be interposed between the bare cell 110 and the protection circuit module 130. The holder 120 may prevent a charging/discharging terminal 134 of the protection circuit module 130 from being pushed inward when a terminal of an external device contacts the charging/discharging terminal 134. Therefore, the secondary battery 100 may be electrically coupled to the external device smoothly; because the holder 120 may prevent the charging/discharging terminal 134 from being pushed inward, even when the thickness of the protection circuit module 130 is reduced.

The bare cell 110 may include an electrode assembly (not shown), a can 111 made of, e.g., metal, to receive the electrode assembly and electrolyte (not shown). A cap assembly 112 may seal an opening of the can 111. The electrode assembly may supply electrical energy and may include an anode, a cathode and a separator therebetween.

The can 111 may be a, e.g., metallic, container having an open upper part. The can may be made of, e.g., aluminum or aluminum alloy, that is lightweight and resistant to corrosion. The electrode assembly may be inserted into and the electrolyte may be injected through the opened upper part, i.e., the upper opening of the can 111. Then, the upper opening may be sealed with the cap assembly 112.

The cap assembly 112 may include a cap plate 113 made of metal, an electrode terminal 114 projecting from the cap plate 113, and a gasket 115 interposed between the cap plate 113 and electrode terminal 114, to insulate them from each other. The can 111 and cap plate 113 together may function as a terminal themselves. In an embodiment, the can 111 and cap plate 113 may function as a cathode. Accordingly, the electrode terminal 114 may serve as an anode. Alternatively, polarities of the can 111, cap plate 113 and electrode terminal 114 may be reversed.

The cap plate 113 may be a flat plate having size and shape corresponding to the upper opening of the can 111. An electrolyte injection hole 116 may be disposed at a side of the cap plate 113. The electrolyte injection hole 116 may be used to inject electrolyte into the can 111. Then, the electrolyte injection hole 116 may be, e.g., sealed with a stopper welded thereto. The cap plate 113 may be made of, e.g., aluminum or aluminum alloy, in order to improve a welding property of the can 111.

An insulation member 117 may be disposed on the cap plate 113 in order to insulate the cap plate 113 from the protection circuit module 130. The insulation member 117 may be formed by, e.g., curing an adhesive or attaching an insulation tape.

The holder 120 may be interposed between the bare cell 110 and the protection circuit module 130. The holder 120 may be disposed on a rear surface of the flexible printed circuit board 131 at a position corresponding to the charging/discharging terminal 134. Thus, even if the terminal of an external device contacts the charging/discharging terminal 134, the holder 120 may prevent the charging/discharging terminal 134 from being pushed inward by supporting the flexible printed circuit board 131.

The holder 120 may include a body 121 and a receiving part 122 disposed inside the body 121. The receiving part 122 may receive electrical components of the protection circuit module 130. The holder 120 may be formed from, e.g., injection molded resin or metal. When the holder 120 is made of metal, it is desirable that an insulation member is disposed on an upper or lower surface of the holder 120 in order to insulate the protection circuit module 130 or bare cell 110 from the holder 120. The insulation member may be formed from, e.g., an adhesive or adhesive tape.

The body 121 may prevent the flexible printed circuit board 131 from being deformed by supporting the flexible printed circuit board 131. In other words, the upper part of the holder 120 may be coupled to the rear surface of the flexible printed circuit board 131 at the position opposite to the charging/discharging terminal 134. The lower part of the holder 120 may be coupled to the bare cell 110, thereby preventing the charging/discharging terminal 134 from being pushed inward.

The body 121 may be formed in various structures and shapes. In an embodiment, the body 121 may be a plate type having an upper part coupled to the protection circuit module 130 and a lower part coupled to the bare cell 110.

The receiving part 122 may receive electrical components disposed on the rear surface of the protection circuit module 130. In an implementation, the receiving part 122 may have a hole shape that passes through upper and lower parts of the body 121, to form at least one receiving space. The hole may be a single rectangular hole that forms a single receiving space space. However, the hole may be formed in various shapes according to need. The electrical components received in the receiving part 122 may include, e.g., passive elements such as a resistor and a capacitor, active elements such as a field effect transistor, a PTC element, an IC, etc.

In another implementation, the receiving part 122 may further include a molding part formed by, e.g., injecting resin in a space between the electrical components and then curing the resin. The molding part may strongly hold the electrical components received in the receiving part 122. Thus, the charging/discharging terminal 134 may be more effectively stabilized when the terminal of the external device contacts the charging/discharging terminal 134. In addition, the molding part may also protect relatively weak electrical components. The molding part may be formed by injecting and curing various resins, e.g., silicone or epoxy resin.

The protection circuit module 130 may be electrically coupled to the bare cell 110. The protection circuit module 130 may include the flexible printed circuit board 131 and, e.g., a PTC device 132, a protection circuit unit 133 and charging/discharging terminal 134, which may be provided on the flexible printed circuit board 131.

The protection circuit module 130 and bare cell 110 may be electrically coupled to each other through various methods.

An anode lead tab 135 of the protection circuit module 130 may be connected to the electrode terminal 114. A cathode lead tab 136 at ends of the flexible printed circuit board 131 may be connected to the cap plate 113, thereby allowing the protection circuit module 130 and bare cell 110 to be electrically coupled to each other. The cathode lead tab 136 and cap plate 113 may be connected to each other by, e.g., laser welding, resistance welding or a screw coupling method. The anode lead tab 135 and cathode lead tab 136 may include, e.g., nickel or a nickel alloy.

The substrate of the protection circuit module 130 may include the flexible printed circuit board 131. A thickness of the substrate may be reduced by using the flexible printed circuit board 131 as the substrate, thereby allowing an overall dimension of the secondary battery to be shortened. Thus, the secondary battery may be miniaturized and lightweight.

As shown in FIG. 1D, a positive temperature coefficient (PTC) device 132 may be electrically coupled between the anode lead tab 135 and the electrode terminal 114, in order to cut off current flow if temperature and/or current is excessively increased. A fixing unit 137 may fix the PTC device 132 to the flexible printed circuit board 131. The fixing unit 137 may have various structures including, e.g., an adhesive or adhesive tape. The PTC device 132 may be disposed at various positions according to need.

Passive elements, e.g., a resistor and/or a capacitor, active elements, e.g., a field effect transistor and/or ICs, may be selectively disposed on the protection circuit unit 133. In addition, the protection circuit unit 133 may charge or discharge the bare cell 110 and prevent, e.g., durability degradation, overheating and explosion of the bare cell 110, by cutting off a charging/discharging path when the bare cell 110 is in an overheated or overcurrent state.

The charging/discharging terminal 134 may contact the external device and may be charged/discharged therethrough. In other words, the charging/discharging terminal 134 may be charged through a charger connected thereto, or discharged through a load connected thereto.

The charging/discharging terminal 134, PTC device 132 and protection circuit unit 133 may be disposed on the flexible printed circuit board 131. Accordingly, it may be difficult to fix the protection circuit module 130 to the bare cell 110 because the flexible printed circuit board 131 may be deformed due to the weight of the charging/discharging terminal 134, PTC device 132 and/or protection circuit unit 133. In addition, when the terminal of the external device contacts the charging/discharging terminal 134, the flexible printed circuit board 131 may be further deformed, thereby causing the charging/discharging terminal 134 to be pushed inward. This problem may be effectively solved by the holder 120 interposed between the protection circuit module 130 and bare cell 110.

The upper case 140 may be coupled to at least one of the protection circuit module 130 and bare cell 110 so as to insulate and protect the protection circuit module 130 from external impact. The upper case 140 may include terminal holes 141 to expose a surface of the charging/discharging terminals 134. In addition, the upper case 140 may include a sidewall 142 to surround a side surface of the protection circuit module 130. The upper case 140 may be, e.g., an injection molded article made of thermoplastic resin.

Figure 2:
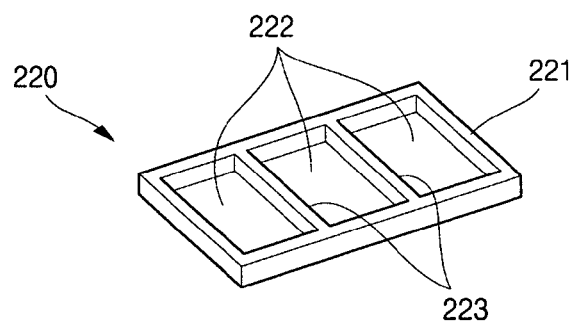
FIG. 2 illustrates a perspective view of a holder according to another embodiment.

FIG. 2 illustrates a perspective view of a holder according to another embodiment. Referring to FIG. 2, a holder 220 may include a plate type body 221 and a hole-shaped receiving part 222 inside the body 221. The receiving part 222 may receive electrical components of the protection circuit module. The holder 220 may also include at least one reinforcing frame 223 that connects opposing side surfaces of the receiving part 222 so as to divide the receiving part 222 into at least two receiving spaces. In an implementation, a molding part may be provided in the receiving part 222 by, e.g., injecting and curing resin, in a space around the electrical components in the receiving part 222.

The body 221 and receiving part 222 may be the same as described in the above embodiment, and repeated description thereof is omitted. Thus, the reinforcing frame 223 will be explained in detail herein.

The reinforcing frame 223 may connect front and rear, or right and left, i.e., opposing, side surfaces of the receiving part 222 to each other, so as to divide the receiving part 222 into at least two receiving spaces. As shown in FIG. 2, the reinforcing frame 223 may be, e.g., a bar having a cubic shape. The reinforcing frame 223 may provide a plurality of receiving spaces that correspond to shapes of the electrical components received in the receiving part 222. The reinforcing frame 223 may help ensure that the receiving spaces have proper dimensions. As described above, the reinforcing frame 223 may stably support the body 221 so the charging/discharging terminal of the protection circuit module is not pushed inward when it contacts the terminal of an external device.

Figure 3A:
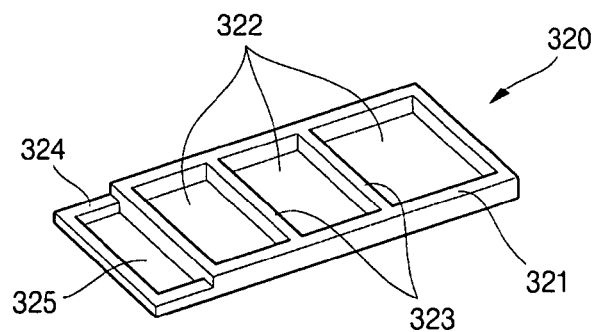
FIG. 3A illustrates a perspective view of a holder according to a still another embodiment.
Figure 3B:
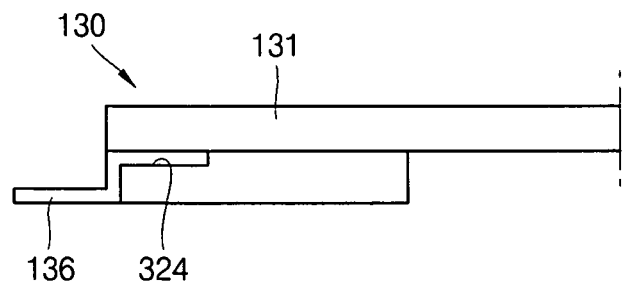
FIG. 3B illustrates a sectional view of a cathode lead tab at an end of the protection circuit module seated on the fixing part of the holder shown in FIG. 3A.

FIG. 3A illustrates a perspective view of a holder 320 according to a still another embodiment. FIG. 3B illustrates a sectional view of the cathode lead tab 136 at an end of the protection circuit module 130 seated on a fixing part 324 of the holder 320 shown in FIG. 3A.

Referring to FIGS. 3A and 3B, the holder 320 may include a body 321, a receiving part 322 inside the body 321 for receiving electrical components of a protection circuit module 130, and a stepped fixing part 324 extending from a side surface of the body 321. A portion of the cathode lead tab 136 at an end of the protection circuit module 130 may be seated on the fixing part 324. The fixing part 324 may further include a through-hole 325 passing through upper and lower parts thereof. In the present embodiment, the receiving part 322 may be a hole that passes through upper and lower parts of the body 321 so as to form at least one receiving space. At least one reinforcing frame 323 may connect opposing side surfaces of the receiving part 322 to each other, thereby forming at least two receiving spaces. A molding part may be further provided in the receiving part 322 by, e.g., injecting and curing resin, into a space around the received electrical components. Repeated explanation about the same elements as the above embodiment will be omitted, and only the fixing part 324 will be explained in detail herein.

The cathode lead tab 136 at the end of the protection circuit module 130 may be seated on the fixing part 324. The fixing part 324 may have a step difference corresponding to the cathode lead tab 136. As shown in FIG. 3B, workability may be improved because an attachment site of the holder 320 on the protection circuit module 130 may be easily and consistently confirmed. In addition, it is possible to prevent lateral movement of the holder 320 by way of the cathode lead tab 136 fixed to the end of the protection circuit module 130.

Figure 4A:
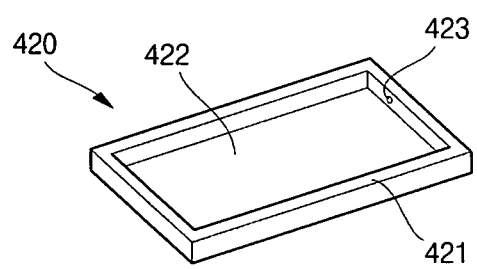
FIG. 4A illustrates a perspective view of a holder according to yet another embodiment.
Figure 4B:
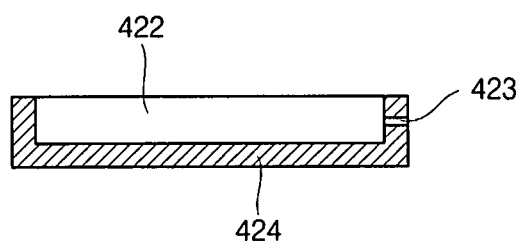
FIG. 4B illustrates a sectional view of the holder shown in FIG. 4A.

FIG. 4A illustrates a perspective view of a holder according to still another embodiment. FIG. 4B illustrates a sectional view of the holder shown in FIG. 4A.

Referring to FIGS. 4A and 4B, a holder 420 may include a plate type body 421 and a hole-shaped receiving part 422 inside the body 421. The receiving part 422 may have a bottom surface and at least one receiving space to receive electrical components of the protection circuit module. In the present embodiment, a molding part may be further provided in the receiving part 422 by, e.g., injecting and curing resin, in a space around the received electrical components. In addition, the body 421 may further include at least one resin injection hole 423 to inject the resin into the receiving part 422. In the present embodiment, at least one reinforcing frame may connect opposing side surfaces of the receiving part 422 to each other. In addition, the holder may further include a stepped fixing part extending from a side surface of the body 421. A portion of the cathode lead tab 136 at the end of the protection circuit module 130 may be seated on the fixing part (see FIG. 3B). Repeated explanation about the same features as the above embodiment will be omitted, and the receiving part 422 and resin injection hole 423 will be explained in detail.

The receiving part 422 may have a groove or recessed shape with a bottom surface 424. The receiving part 422 may receive the electrical components of the protection circuit module. As shown in FIG. 4A, the groove may be a singular rectangular groove. Alternatively, the groove may have various shapes, e.g., a round, and numbers, according to need. The receiving part 422 may advantageously ensure sufficient support due to the presence of the bottom surface 424, even if a molding member is omitted.

When the bottom surface 424 is formed, it may be desirable to include an injected and cured resin molding part in order to fix the electrical components and protect relatively weak components. When the molding part is included as described above, at least one resin injection hole 423 may be disposed in the body 421 to inject resin into the receiving part 422. As shown in FIG. 4B, the resin injection hole 423 may pass through a side surface of the body 421. Alternatively, the resin injection hole 423 may pass through, e.g., the bottom surface 424. The resin injection hole 423 may be formed in, e.g., a polygonal shape or a cylindrical shape, according to need.

A coupling relationship of the secondary battery will be explained below. The holder shown in FIG. 3 will be explained as an example.

Figure 5A:
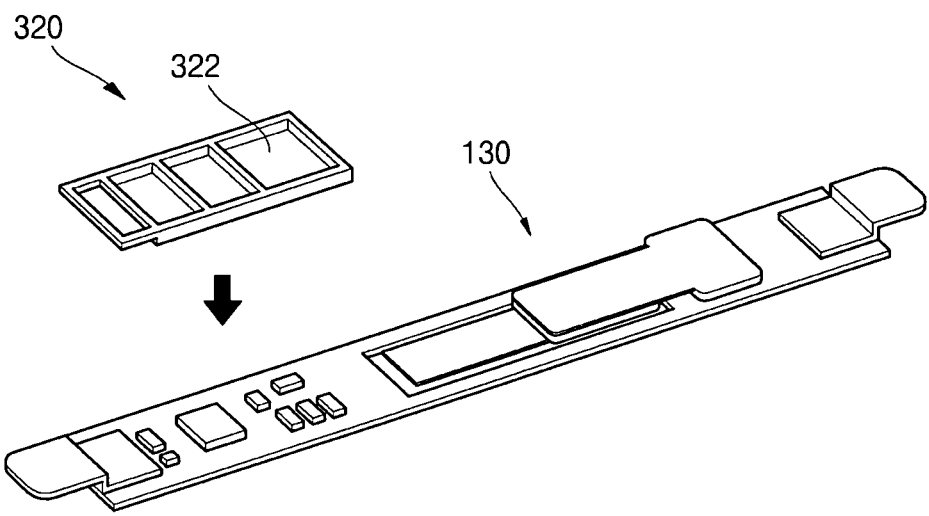
FIG. 5A illustrates a perspective view of a protection circuit module and a holder according to an implementation.
Figure 5B:
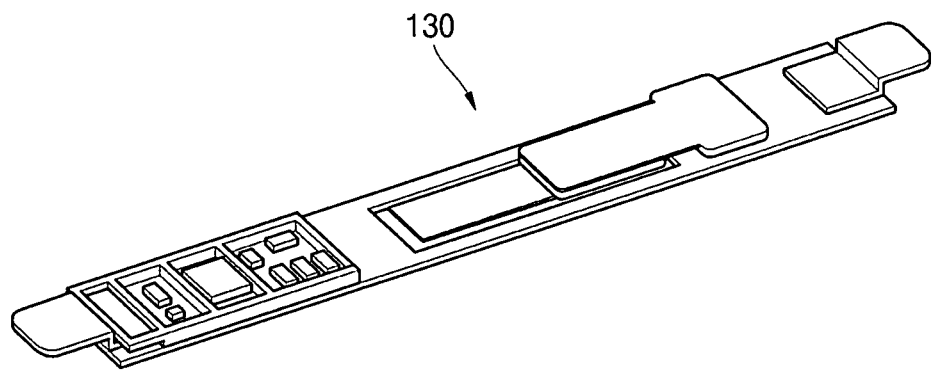
FIG. 5B illustrates a perspective view of the holder of FIG. 5A installed on the protection circuit module.
Figure 5C:
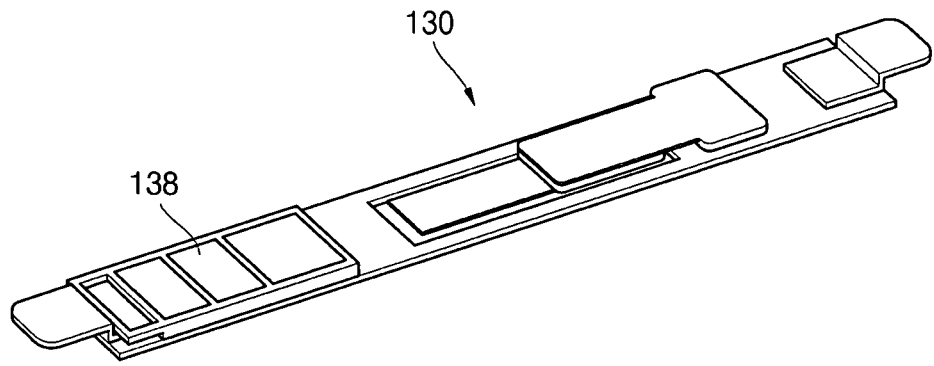
FIG. 5C illustrates a perspective view of the protective circuit module of FIG. 5B showing a molding part formed in the holder.
Figure 5D:
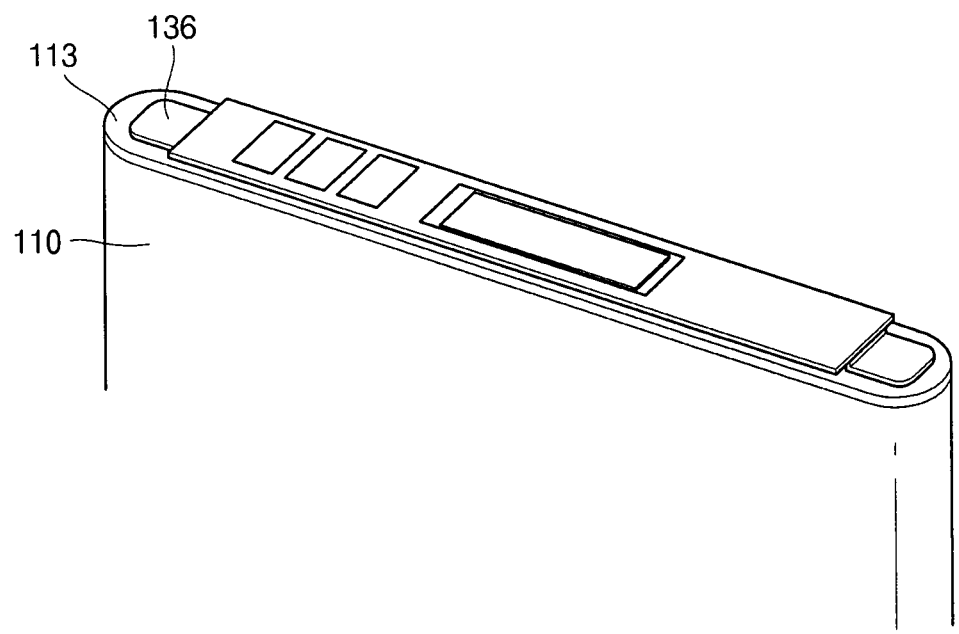
FIG. 5D illustrates a perspective view of the protection circuit module with the holder of FIG. 5C attached to the bare cell.

FIG. 5A illustrates a perspective view of a protection circuit module 130 and a holder 320 according to an embodiment. FIG. 5B illustrates a perspective view wherein the holder 320 of FIG. 5A is installed in the protection circuit module 130. FIG. 5C illustrates a perspective view where a molding part is formed in the holder 320 of FIG. 5B. FIG. 5D illustrates a perspective view of the protection circuit module 130 including the holder 320 of FIG. 5C attached to the bare cell 110.

Referring to FIGS. 5A to 5D, according to an embodiment, the holder 320 may be disposed between the bare cell 110 and protection circuit module 130. The holder 320 may be coupled to the protection circuit module 130 and then coupled to the bare cell 110.

More particularly, as shown in FIGS. 5A and 5B, the holder 320 may be coupled to a rear surface of the protection circuit module 130. Electrical components on the rear surface of the protection circuit module 130 may be received in the receiving part 322 of the holder 320. The protection circuit module 130 and holder 320 may be coupled to each other through any suitable attaching technology, e.g., an adhesive or adhesive tape.

After the holder 320 is coupled to the rear surface of the protection circuit module 130, the molding part 138 may be formed by, e.g., injecting resin into the receiving part 322 of the holder 320 and curing the resin as shown in FIG. 5C. The resin may include, e.g., epoxy resin, silicone resin, etc.

When formation of the molding part 138 is completed, the protection circuit module 130 including the holder 320 may be coupled to the bare cell 110 as shown in FIG. 5D. The protection circuit module 130 and bare cell 110 may be electrically coupled to each other, e.g., by welding the cathode lead tab 136 to the cap plate 113. An insulation member 117 may be disposed on the bare cell 110 to insulate the bare cell 110 from the protection circuit module 130. The insulation member 117 may be formed by, e.g., curing an adhesive or attaching an insulation tape.

Figure 6A:
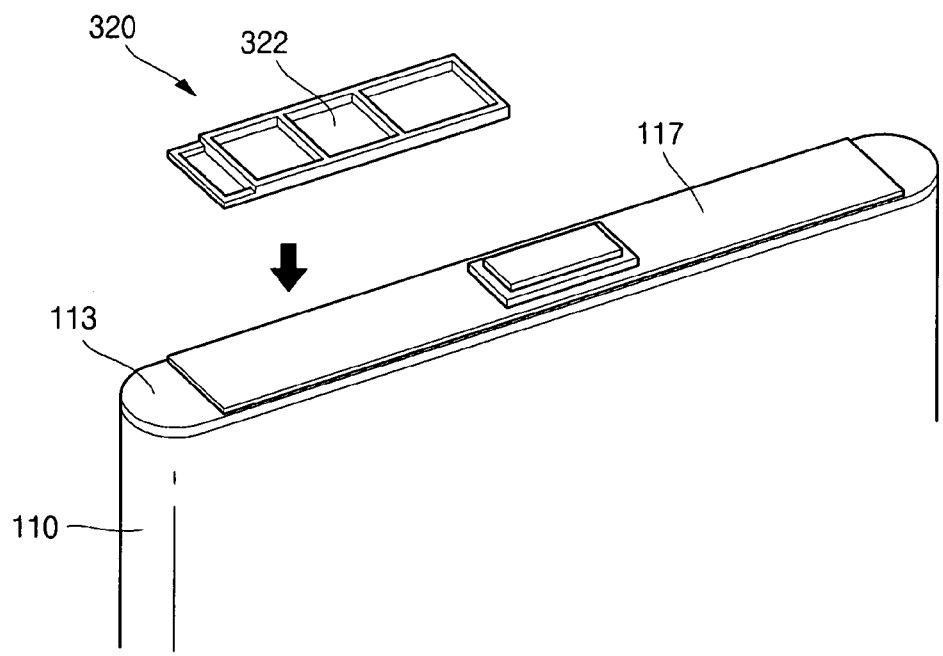
FIG. 6A illustrates an exploded perspective view of a bare cell and a holder according to another implementation.
Figure 6B:
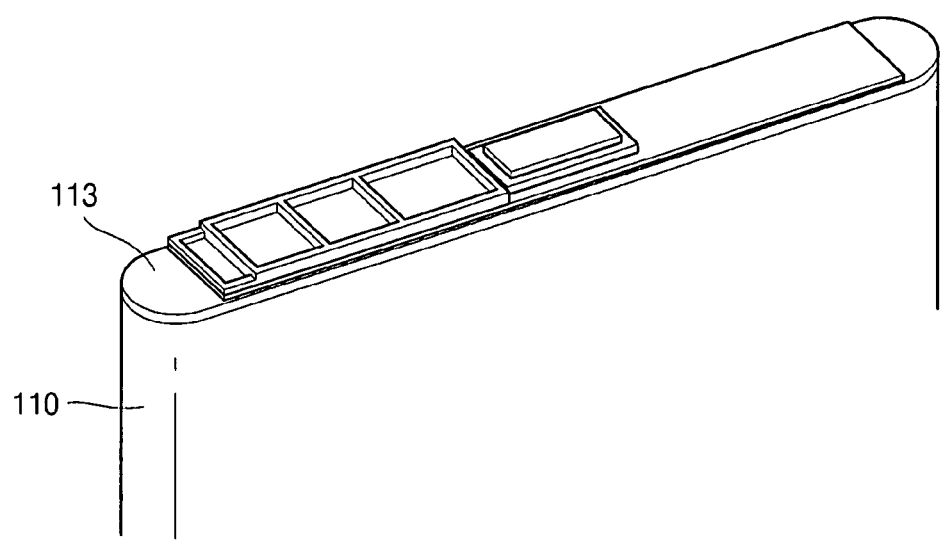
FIG. 6B illustrates a perspective view of the holder of FIG. 6A installed on the bare cell.
Figure 6C:
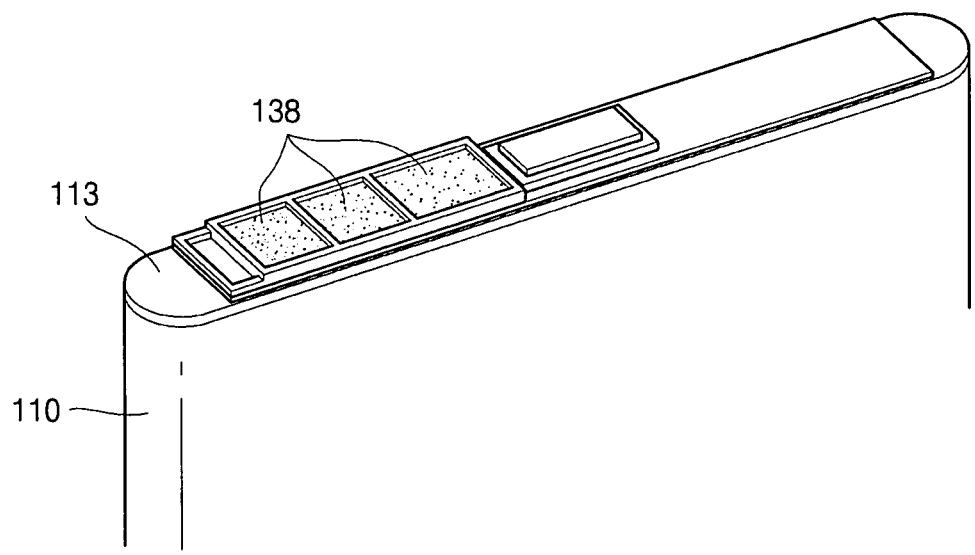
FIG. 6C illustrates a perspective view of a molding part formed in the holder of FIG. 6B.
Figure 6D:
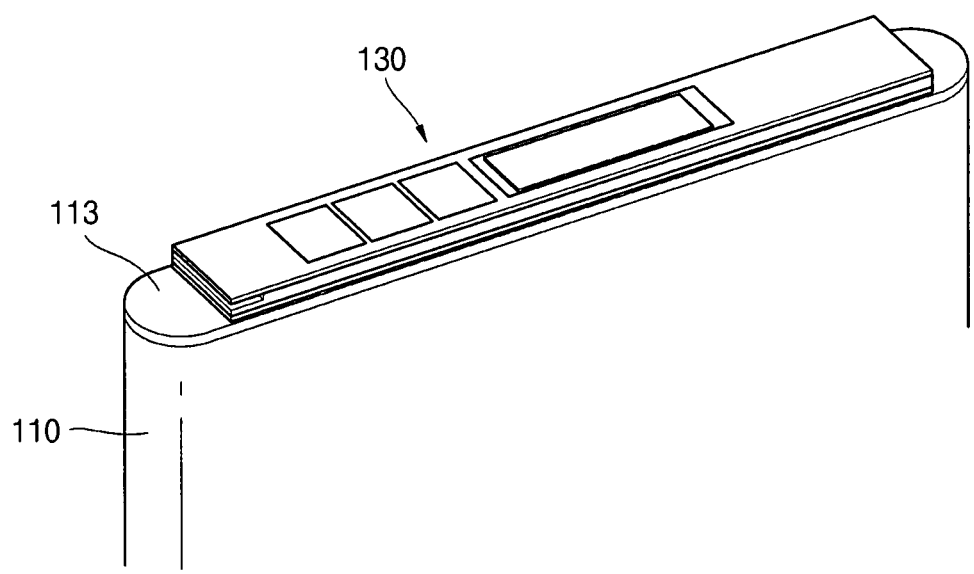
FIG. 6D illustrates a perspective view of the protection circuit module attached to an upper surface of the bare cell provided with the holder of FIG. 6C.

FIG. 6A illustrates an exploded perspective view of a bare cell 110 and a holder 320 according to an embodiment. FIG. 6B illustrates a perspective view of the holder 320 of FIG. 6A installed on the bare cell 110. FIG. 6C illustrates a perspective view of the molding part 138 in the holder 320 of FIG. 6B. FIG. 6D illustrates a perspective view of the protection circuit module 130 attached to an upper surface of the bare cell 110 including the holder 320 of FIG. 6C.

Referring to FIGS. 6A to 6D, according to an embodiment, the holder 320 may be disposed between the bare cell 110 and the protection circuit module 130. The holder 320 may be coupled to the protection circuit module 130 and then coupled to the bare cell 110.

More particularly, as shown in FIGS. 6A to 6B, the holder 320 may be coupled to an upper part of the bare cell 110, i.e., an upper surface of the cap plate 113. The holder 320 may be attached at a position such that electrical components on the rear surface of the protection circuit module 130 may be received in the receiving part 322. The bare cell 110 and holder 320 may be coupled each other through any suitable attaching technology, e.g., an adhesive or adhesive tape.

After the holder 320 is coupled to the upper part of the bare cell 110, as shown in FIG. 6C, the molding part 138 may be formed by injecting resin into the receiving part 322 of the holder 320, and curing the resin. The resin may include, e.g., epoxy resin, silicone resin, etc. The protection circuit module 130 may be coupled to the upper part of the bare cell 110 before the resin is completely cured. The electrical components disposed on the rear surface of the protection circuit module 130 may be received in the receiving part 322 of the holder 320. The protection circuit module 130 and bare cell 110 may be coupled to each other by any suitable technology as described above. For example, the cathode lead tab 136 at ends of the protection circuit module 130 may be welded to the cap plate 113. In addition, the insulation member 117 may be disposed on the bare cell 110 to insulate the bare cell from the protection circuit module 130. The insulation member 117 may be formed by, e.g., curing an adhesive or attaching an insulation tape.

The secondary battery described above overcomes drawbacks of other secondary batteries. With respect to such batteries, when the thickness of the printed circuit board is reduced, pressure applied to the charging/discharging terminal of the protection circuit module—when, e.g., a terminal of an external device contacts the charging/discharging terminal—may press the thin printed circuit board inward. This may cause an electrical short between the secondary battery and external device. Accordingly, the external device may not be smoothly driven or the secondary battery may not be smoothly charged or discharged.

As described above, the secondary battery according to an embodiment may produce the following effects:

The charging/discharging terminal of the protection circuit module may be prevented from being pushed inward when the terminal of an external device contacts the charging/discharging terminal by disposing a holder between the printed circuit module and bare cell. In particular, when the protection circuit module includes a flexible printed circuit board, the holder may be disposed on the rear surface of the flexible printed circuit board at a position corresponding to the charging/discharging terminal. Thus, a secondary battery may be smoothly electrically coupled to the external device.

Relatively weak electrical components may be protected because the electrical components of the protection circuit unit may be contained in the receiving part of the holder.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A secondary battery, comprising:
    a bare cell;
    a protection circuit module electrically coupled to the bare cell; and
    a holder between the bare cell and the protection circuit module, wherein:
        the protection circuit module includes a flexible printed circuit board having an upper and a lower surface, a charging/discharging terminal on the upper surface of the flexible printed circuit board and a protection circuit unit on the lower surface of the flexible printed circuit board opposite to the charging/discharging terminal, and
        the holder is disposed on the protection circuit unit on the lower surface of the flexible printed circuit board, the holder including a plate type body and a hollow receiving part inside the plate type body, the receiving part accommodating the protection circuit unit therein.

2. The secondary battery as claimed in claim 1, wherein the hollow receiving part further includes a cured resin molding part surrounding the protection circuit unit.

3. The secondary battery as claimed in claim 2, wherein the molding part includes at least one of a cured silicone resin and cured epoxy resin.

4. The secondary battery as claimed in claim 1, wherein the hollow receiving part includes a hole having at least one receiving space and the hole passes through the body.

5. The secondary battery as claimed in claim 4, wherein the holder includes opposing side surfaces and at least one reinforcing frame, the reinforcing frame connecting the opposing side surfaces so as to provide the receiving part with at least two receiving spaces.

6. The secondary battery as claimed in claim 1, wherein:
    the protection circuit module has an end and includes a cathode lead tab at the end,
    the holder includes a side and a stepped fixing part extending from the side, and
    a portion of the cathode lead tab is seated on the stepped fixing part.

7. The secondary battery as claimed in claim 6, wherein the fixing part includes a through-hole passing therethrough.

8. The secondary battery as claimed in claim 1, wherein the hollow receiving part includes a groove having a bottom surface defining at least one receiving space.

9. The secondary battery as claimed in claim 8, wherein the body includes at least one resin injection hole.

10. The secondary battery as claimed in claim 1, wherein the holder has a lower part and an insulation member is interposed between the lower part of the holder and the bare cell.

11. The secondary battery as claimed in claim 9, wherein the insulation member includes at least one of an insulation tape and cured adhesive.

* * * * *